US007024003B2

(12) United States Patent
Dupeire

(10) Patent No.: US 7,024,003 B2
(45) Date of Patent: Apr. 4, 2006

(54) WIRELESS SPEAKER SYSTEM SUITABLE FOR HARD-WIRED AUDIO SYSTEM

(75) Inventor: Wesley Joseph Dupeire, Prairieville, LA (US)

(73) Assignee: BellSouth Intellectual Property Corporation, Wilmington, DE (US)

( * ) Notice: Subject to any disclaimer, the term of this patent is extended or adjusted under 35 U.S.C. 154(b) by 128 days.

(21) Appl. No.: 10/608,916

(22) Filed: Jun. 26, 2003

(65) Prior Publication Data

US 2004/0264708 A1 Dec. 30, 2004

(51) Int. Cl.

*H04B 5/00* (2006.01)
*H04B 3/00* (2006.01)
*H03G 5/00* (2006.01)
*H04R 5/02* (2006.01)

(52) U.S. Cl. .......................... 381/79; 381/77; 381/311; 381/300; 381/98; 381/307

(58) Field of Classification Search ................ 381/334, 381/111, 98–99, 2, 79, 300, 311

See application file for complete search history.

(56) References Cited

U.S. PATENT DOCUMENTS

| | | | | |
|---|---|---|---|---|
| 5,666,422 | A * | 9/1997 | Harrison et al. | 381/18 |
| 5,673,323 | A * | 9/1997 | Schotz et al. | 381/2 |
| 6,212,282 | B1 | 4/2001 | Mershon | 381/77 |
| 6,487,296 | B1 * | 11/2002 | Allen et al. | 381/80 |
| 6,590,982 | B1 * | 7/2003 | Chen | 381/2 |
| 6,608,907 | B1 * | 8/2003 | Lee | 381/311 |
| 2002/0072816 | A1 * | 6/2002 | Shdema et al. | 700/94 |
| 2003/0235314 | A1 * | 12/2003 | Wang | 381/79 |
| 2004/0037433 | A1 * | 2/2004 | Chen | 381/79 |
| 2004/0223622 | A1 * | 11/2004 | Lindemann et al. | 381/79 |

* cited by examiner

*Primary Examiner*—Laura A. Grier
(74) *Attorney, Agent, or Firm*—Cantor Colburn LLP

(57) ABSTRACT

A wireless speaker system used in conjunction with a hard-wired audio system is provided. The wireless speaker system includes a wireless transmitter module including an input connected to a wired speaker output of a main component of the hard-wired audio system. The wireless transmitter module transmits an output signal of a predefined frequency carrying the output signal of the main component. A wireless receiver module including an output connected to the wired speaker input of the external speaker receives the output signal on the predefined frequency and the external speaker responds to the output signal.

13 Claims, 2 Drawing Sheets

WIRELESS SPEAKER SYSTEM SUITABLE FOR HARD-WIRED AUDIO SYSTEM

BACKGROUND OF THE INVENTION

The present disclosure relates generally to a wireless speaker system, more particularly, to a wireless speaker system which can be used in conjunction with a hard-wired audio system and method for converting a hard-wired audio system to a wireless audio system.

Current home entertainment systems generally require their speakers to be hard-wired back to the main system components. Thus, the complexity of these systems is increasing. For example, surround sound systems use six speakers, some of which may be located at a considerable distance from the main system. Because wires must be run to each speaker throughout a room and potentially throughout a house, the distraction or nuisance of the wires increases the complexity of the systems.

The drawbacks of hard-wired systems have been addressed in part by home entertainment systems including wireless speaker systems. These entertainment systems include the wireless speaker systems exclusively used in their main system components. These wireless speaker systems cannot be used in conjunction with existing wired home entertainment systems. There is no way to combine the existing hard-wired systems with the new wireless speaker systems. Thus, customers purchase an entirely new home entertainment system to obtain the wireless speaker system. Further, these new home entertainment systems tend to cost considerably more than common hard-wired systems.

Thus, there is a need for a wireless speaker system that can be used in conjunction with an existing hard-wired audio system.

BRIEF DESCRIPTION OF THE INVENTION

The present invention provides a wireless speaker system used in conjunction with an existing hard-wired audio system.

The present invention provides a method for converting a hard-wired audio system to a wireless audio system with a low cost.

According to one aspect of the invention, wireless speaker system suitable for a hard-wired audio system, comprises a wireless transmitter module including an input for connection to a wired speaker output of a main component of the hard-wired audio system, the wireless transmitter module transmitting an output signal of a first predefined frequency carrying a first output signal of the main component and an output signal of a second predefined frequency carrying a second output signal of the main component, the first frequency being different than the second frequency; a first wireless receiver module including an output for connection to a wired speaker input of a first external speaker, the first wireless receiver module receiving the first output signal on the first predefined frequency and the first external speaker responding to the first output signal; and a second wireless receiver module including an output for connection to a wired speaker input of a second external speaker, the second wireless receiver module receiving the second output signal on the second predefined frequency and the second external speaker responding to the second output signal.

Another aspect of the invention is an audio system, comprising a hard-wired stereo component including at least one output, the output generating an output signals; a first external speaker and a second external speaker; a wireless transmitter module including an input for connection to a wired speaker output of a main component of the hard-wired audio system, the wireless transmitter module transmitting an output signal of a first predefined frequency carrying a first output signal of the main component and an output signal of a second predefined frequency carrying a second output signal of the main component, the first frequency being different than the second frequency; a first wireless receiver module including an output for connection to a wired speaker input of a first external speaker, the first wireless receiver module receiving the first output signal on the first predefined frequency and the first external speaker responding to the first output signal; and a second wireless receiver module including an output for connection to a wired speaker input of a second external speaker, the second wireless receiver module receiving the second output signal on the second predefined frequency and the second external speaker responding to the second output signal.

Another aspect of the invention is a method for converting a hard-wired audio system to a wireless audio system, comprising connecting left and right inputs of a wireless transmitter module to left and right wired speaker outputs of a main component of the hard-wired audio system; connecting outputs of left and right wireless receiver modules to the wired speaker inputs of left and right external speakers; wherein the wireless transmitter module transmits left and right output signals on different frequencies carrying left and right outputs of the main component to the left and right wireless receiver modules and the left and right external speakers respond to the left and right output signals on different frequencies through the left and right wireless receiver modules, respectively.

BRIEF DESCRIPTION OF THE DRAWINGS

Referring to the exemplary drawings wherein like elements are numbered alike in the several FIGURES.

DETAILED DESCRIPTION OF THE INVENTION

A wireless speaker system according to exemplary embodiments of the present invention is used in conjunction with an existing hard-wired audio system of which the main component is originally designed for a wired connection to a speaker. The wireless speaker system employs a wireless transmitter module and a wireless receiver module, instead of wires connected between the main component and the external speakers of the hard-wired audio system. The wireless transmitter module transmits an output signal from the main component on a predefined frequency to the receiver module connected to the external speakers receiving the signal having the predefined frequency.

Thus, the wires (that connected between the main component and the external speakers) are eliminated by connecting the wireless transmitter module and the receiver module to the main component and the external speakers, respectively.

Figure 1:
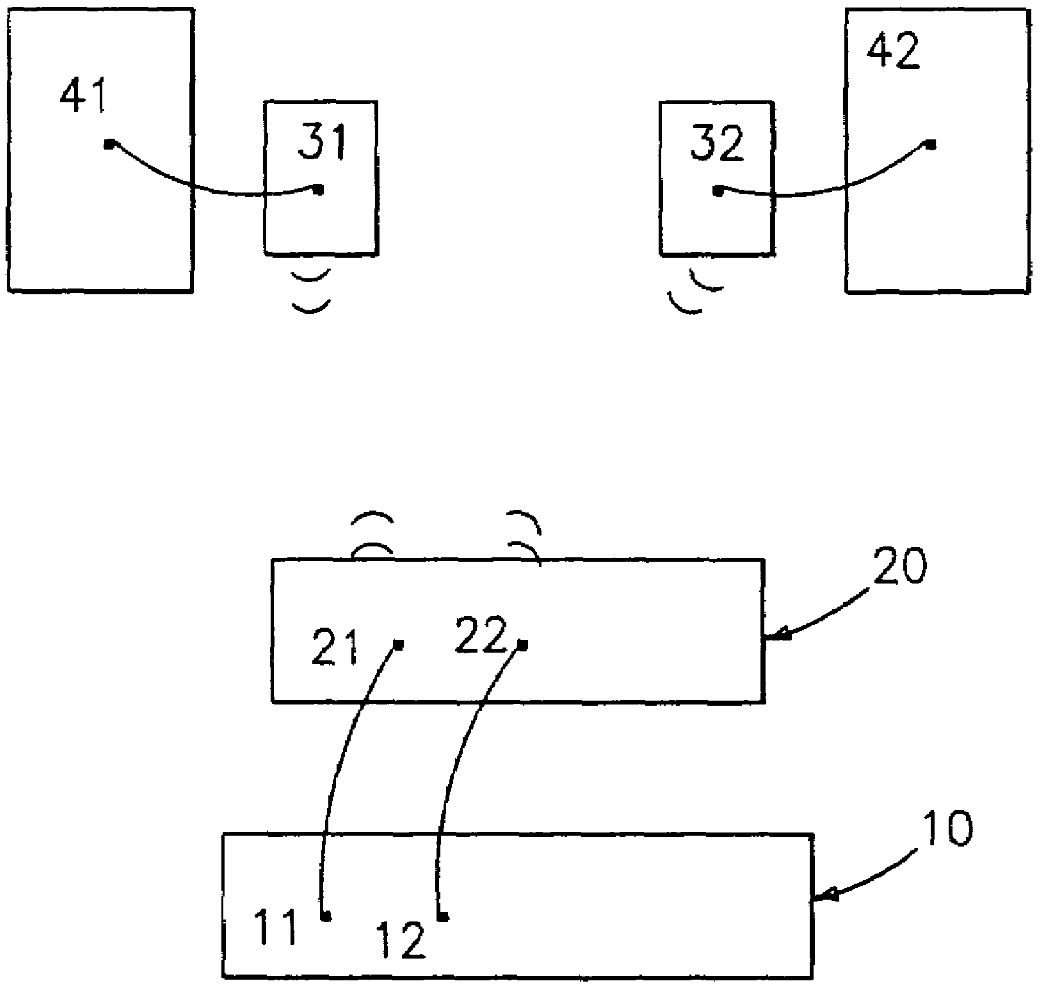
FIG. 1 is a block diagram of an exemplary wireless speaker system used in conjunction with a hard-wired audio system.

FIG. 1 shows a wireless speaker system according to an exemplary embodiment of the invention. In FIG. 1, a hard-wired audio system 10 includes a home stereo system or a surround sound home theater system with features such as AM/FM, Cassette, CD, DVD, etc. The hard-wired audio system 10 further includes any audio system that requires external speakers in a home or commercial environment, such as intercom systems, public address systems, etc.

The wireless speaker system includes a wireless transmitter module 20 and at least one wireless receiver, for instance, left and right wireless receiver modules 31 and 32. The input jack of the wireless transmitter module 20 is connected to the output jack of the hard-wired audio system 10. For instance, the left and right input jacks 21 and 22 of the wireless transmitter module 20 are connected to the left and right output jacks 11 and 12 of the hard-wired audio system 10.

The left and right input jacks 21 and 22 of the wireless transmitter module 20 are connected to the left and right output jacks 11 and 12 of the hard-wired audio system 10 in the same manner as the left and right output jacks 11 and 12 would be connected directly to the input jacks of corresponding external speakers, for instance, the input jacks of left and right speakers 41 and 42. The left and right output jacks 11 and 12 are wired speaker outputs.

The wireless transmitter module 20 may have AC power source, and include a frequency, volume, balance, fade, tone or equalization adjustment. The wireless transmitter module 20 may further include an amplifier.

The hard-wired audio system 10 may generate separate output signals (left and right channel) to maintain the distinct sounds generated by each channel. In this case, the wireless transmitter module 20 transmits the output signals on separate frequencies from the hard-wired audio system 10 to the left and right wireless receiver modules 31 and 32, by means of radio, infrared or other wireless transmission technology. Thus, receiver module 31 is set to receive a first frequency and receiver module 32 is set to receive a second frequency, different than the first frequency.

The left and right wireless receiver modules 31 and 32 are located near the left and right speakers 41 and 42, respectively. The connections between the output jacks of the left and right wireless receiver modules 31 and 32 and the wired speaker input jacks of the left and right speakers 41 and 42 are the same type of connections used if wires connected the input jacks of the left and right speakers 41 and 42 and the left and right output jacks 11 and 12 of the hard-wired audio system 10.

Because each of the wireless receiver modules 31 and 32 responds to a unique signal of a defined frequency transmitted from the wireless transmitter module 20, each of the wireless receiver modules 31 and 32 drives one of the speakers 41 and 42 that corresponds to the defined frequency. For example, the left wireless receiver module 31 receives the left channel signal of the left output jack 11 of the hard-wired audio system 10 on a defined frequency.

The left and right wireless receiver modules 31 and 32 may have AC or DC power source, and include features such as frequency, volume, balance, fade, tone and equalization adjustments.

Although the wireless transmitter module 20 according to the exemplary embodiment is described to transmit signals in separate frequencies, the wireless transmitter module may send the same signal to multiple wireless receiver modules. In this way, the same audio from the hard-wired audio system 10 may be heard in multiple locations at the same time, such as, multiple rooms in a house or at inside and outside locations simultaneously. Alternatively, the left and right channels of the left and right jacks 11 and 12 of the hard-wired audio system 10 may be transmitted in several frequencies. By transmitting each channel in several frequencies, multiple wireless receiver modules may be used with greater sound control.

Figure 2:
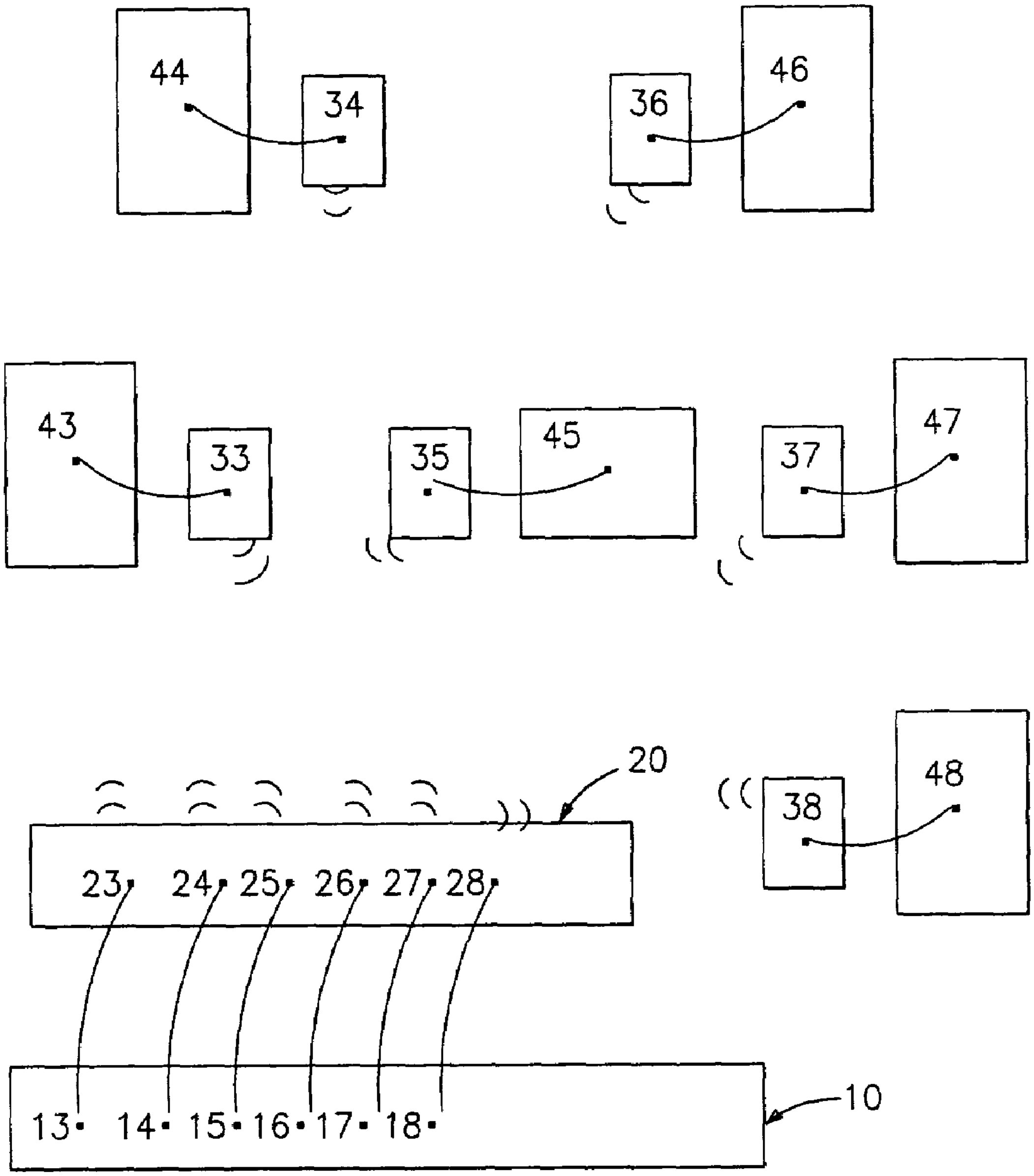
FIG. 2 is a block diagram of an alternate exemplary wireless speaker system used in conjunction with a hard-wired home theater system.

FIG. 2 shows a wireless speaker system according to an alternate exemplary embodiment of the invention. In FIG. 2, a main surround sound home theater system 10 is connected to a wireless transmitter module 20, and a plurality of external speakers 43–48 is connected to a plurality of wireless receiver modules 33–38.

The main surround sound home theater system 10 includes a left front output jack 13, a left rear output jack 14, a center output jack 15, a right rear output jack 16, a right front output jack 17 and a subwoofer output jack 18. These wired speaker output jacks 13–18 are connected to corresponding wired input jacks 23–28 of the wireless transmitter module 20 in the same manner as these output jacks 13–18 would be connected directly to the input jacks of the speakers 43–48.

For instance, the left front output jack 13 is connected to the left front input jack 23 of the wireless transmitter module 20 in the same manner as the left front output jack 13 would be connected to the input jack of the left front speaker 43 if wires were used. Similarly, the left rear output jack 14, the center output jack 15, the right rear output jack 16, the right front output jack 17 and the subwoofer output jack 18 of the main surround sound home theater system 10 are connected to the left rear input jack 24, the center input jack 25, the right rear input jack 26, the right front input jack 27 and the subwoofer input jack 28 of the wireless transmitter module 20, respectively.

The output jacks of the wireless receive modules 33–38 are connected to the wired speaker input jacks of the speakers 43–48 in the same manner as the input jacks of the speakers 43–48 would be directly to the output jacks 13–18 of the main surround sound system 10 if wires were used. For instance, the output jack of the left front wireless receive module 33 is connected to the wired speaker input jack of the left front speaker 43 in the same manner as the input jack of the left front speaker 43 would be directly connected to the left front output jack 13 of the main surround sound system 10 if wires were used. Similarly, the left rear wireless receiver module 34, the center wireless receive module 35, the right rear wireless receive module 36, the right front wireless receive module 37 and the subwoofer wireless receive module 38 are connected to the left rear speaker 44, the center speaker 45, the right rear speaker 46, the right front speaker 47 and the subwoofer speaker 48, respectively.

In the wireless speaker system according to the exemplary embodiment of the invention, the frequency band used by wireless transmitter module 20 for each channel of the output jacks of the main surround sound home theater system 10 is predefined so that the speaker corresponding to the channel receives the best signal. Also, each of the wireless receiver modules 33–38 responds to a predefined frequency and is connected to the speaker that corresponds to the channel for the predefined frequency. For instance, the center wireless receive module 35 that receives the surround sound center channel signal of the center output jack 25 is connected to the center speaker 45 corresponding to the surround sound center channel signal.

The wireless transmitter module 20 or each of wireless receive modules 33–38 may have frequency, volume, balance, fade, tone or equalization adjustment. The wireless transmitter module 20 may further include an amplifier.

According to the exemplary embodiments of the invention, using external speakers for a hard-wired audio system does not require that wires be run to each external speaker.

Further, the wireless speaker system according to the exemplary embodiments of the invention has the cost benefit associated with the reuse of existing audio systems, because the complete replacement of the existing audio system is not needed.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A wireless speaker system suitable for a hard-wired audio system, comprising:

a wireless transmitter module including an input for connection to a wired speaker output of a main component of the hard-wired audio system, the wireless transmitter module transmitting an output signal of a first predefined frequency carrying a first output signal of the main component and an output signal of a second predefined frequency carrying a second output signal of the main component the first predefined frequency being different than the second predefined frequency;

a first wireless receiver module including an output for connection to a wired speaker input of a first external speaker, the first wireless receiver module receiving the first output signal on the first predefined frequency and the first external speaker responding to the first output signal; and a second wireless receiver module including an output for connection to a wired speaker input of a second external speaker, the second wireless receiver module receiving the second output signal on the second predefined frequency and the second external speaker responding to the second output signal;

wherein the main component of the hard-wired audio system includes left front and rear wired speaker outputs, right front and rear wired speaker outputs, a center wired speaker output and a subwoofer wired speaker output, the wireless transmitter module includes left front and rear inputs, right front and rear inputs, a center input and subwoofer input, the first and second wireless receiver modules includes left front and rear wireless receiver modules, right front and rear wireless receiver modules, center wireless receiver module and a subwoofer wireless receiver module, and the external speaker includes left front and rear speaker, right front and rear speaker, a center speaker and a subwoofer speaker;

wherein the left front and rear wired speaker outputs, right front and rear wired speaker outputs, center wired speaker output and subwoofer wirer speaker output of the main component are connected to the left front and rear inputs, right front and rear inputs, center input and subwoofer input of the wireless transmitter module, respectively; and wherein outputs of the left front and rear, right front and rear, center and subwoofer wireless receiver modules are connected to wired speaker inputs of the left front and rear, right front and rear, center and subwoofer external speakers.

2. The system of claim 1, wherein the wireless transmitter module includes AC power source.

3. The system of claim 1, wherein the first and second wireless receiver modules include AC or DC power source.

4. The system of claim 1, wherein the wireless transmitter module includes a frequency, volume, balance, fade, tone or equalization adjustment.

5. The system of claim 4, wherein the wireless transmitter module further includes an amplifier.

6. The system of claim 1, wherein the first and second wireless receiver modules include a frequency, volume, balance, fade, tone or equalization adjustment.

7. The system of claim 1, wherein the main component of the hard-wired audio system includes left and right channels, the first output signal corresponding to the left channel and the second output signal corresponding to the right channel.

8. The system of claim 1, wherein the wireless transmitter module transmits the output signals of the first and second predefined frequencies by radio or infrared transmission.

9. The system of claim 1, wherein the left front and rear wired speaker outputs, right front and rear wired speaker outputs, center wired speaker output and subwoofer wired speaker output of the main component generate left front and rear output signals, right front and rear output signals, center output signal and subwoofer output signals;

wherein the wireless transmitter module transmits the left front and rear output signals, right front and rear output signals, center output signal and subwoofer output signals to the left front and rear, right front and rear, center and subwoofer wireless receiver modules on different frequencies.

10. A wireless speaker system suitable for a hard-wired audio system comprising:

a wireless transmitter module including an input for connection to a wired speaker output of a main component of the hard-wired audio system the wireless transmitter module transmitting an output signal of a first predefined frequency carrying a first output signal of the main component and an output signal of a second predefined frequency carrying a second output signal of the main component, the first predefined frequency being different than the second predefined frequency;

a first wireless receiver module including an output for connection to a wired speaker input of a first external speaker, the first wireless receiver module receiving the first output signal on the first predefined frequency and the first external speaker responding to the first output signal; and a second wireless receiver module including an output for connection to a wired speaker input of a second external speaker, the second wireless receiver module receiving the second output signal on the second predefined frequency and the second external speaker responding to the second output signal, wherein the main component of the hard-wired audio system includes left front and rear wired speaker outputs and right front and rear wired speaker outputs, the wireless transmitter module includes left front and rear inputs and right front and rear inputs, the first and second wireless receiver modules include left front and rear wireless receiver modules and right front and rear wireless receiver modules, and the external speaker includes left front and rear speakers and right front and rear speakers;

wherein the left front and rear wired speaker outputs and right front and rear wired speaker outputs of the main component are connected to the left front and rear inputs and right front and rear inputs of the wireless transmitter module, respectively; and wherein outputs of the left front and rear and right front and rear wireless receiver modules are connected to wired speaker inputs of the left front and rear and right front and rear external speakers.

11. The system of claim 10, wherein main component generates left front and rear output signals and right front and rear output signals;

wherein the wireless transmitter module transmits the left front and rear output signals and the right front and rear output signals on different frequencies.

12. The system of claim 10, wherein the main component of the hard-wired audio system includes a center wired speaker output, the wireless transmitter module includes a center input, the first and second wireless receiver modules include a center wireless receiver module, and the external speaker includes a center speaker;

wherein the center wired speaker output of the main component is connected to the center input of the wireless transmitter module, and wherein outputs of the center wireless receiver module are connected to wired center external speakers.

13. The system of claim 10, wherein the main component of the hard-wired audio system includes a subwoofer wired speaker output, the wireless transmitter module includes a subwoofer input, the first and second wireless receiver modules include a subwoofer wireless receiver module, and the external speaker includes a subwoofer speaker;

wherein the subwoofer wired speaker output of the main component is connected to the subwoofer input of the wireless transmitter module, and wherein outputs of the subwoofer wireless receiver module are connected to wired subwoofer external speakers.

* * * * *